United States Patent [19]
Mischel et al.

[11] Patent Number: 5,523,611
[45] Date of Patent: Jun. 4, 1996

[54] INTEGRATED SEMICONDUCTOR ARRAY COMBINATION WITH STANDARD ELEMENTS

[75] Inventors: Peter Mischel; Jasbeer-Singh Suri, both of Heilbronn; Ulrich Wicke, Flein, all of Germany

[73] Assignee: Temic Telefunken microelectronic GmbH, Heilbronn, Germany

[21] Appl. No.: 361,701

[22] Filed: Dec. 22, 1994

Related U.S. Application Data

[63] Continuation of Ser. No. 136,822, Oct. 18, 1993, abandoned.

[30] Foreign Application Priority Data

Nov. 6, 1992 [DE] Germany .......................... 42 37 608.4

[51] Int. Cl.⁶ .............................. H01L 31/06; H01L 27/10
[52] U.S. Cl. .......................... 257/461; 257/202; 257/205; 257/370; 257/443; 257/465
[58] Field of Search ................................... 257/370, 465, 257/202, 205, 443, 461

[56] References Cited

U.S. PATENT DOCUMENTS

| | | | |
|---|---|---|---|
| 4,994,887 | 2/1991 | Hutter et al. | 257/370 |
| 5,055,716 | 10/1991 | El Gamel | 257/205 |
| 5,162,887 | 11/1992 | Dierschke | 257/465 |

FOREIGN PATENT DOCUMENTS

| | | |
|---|---|---|
| 0233526A2 | 8/1987 | European Pat. Off. . |
| 0443332 | 8/1991 | European Pat. Off. . |
| 0443332A1 | 8/1991 | European Pat. Off. . |
| 3635137A1 | 4/1987 | Germany . |
| 3706252C2 | 9/1987 | Germany . |
| 3802065C2 | 2/1989 | Germany . |
| 4015597A1 | 11/1990 | Germany . |
| 1025296 | 12/1984 | U.S.S.R. . |

OTHER PUBLICATIONS

Zürl, K.; Streibl, N.: "Optoelectronic array interconnections," 24, (1992), pp. 405–414, *Optical and Quantum Electronics*.

Audet, S. A.: Schoonefeld; "High–Purity Silicon Radiation–Sensor Array". In: *Nuclear Instruments and Methods in Physics Research A275*, 1989, pages 517–526.

Forrest, St.R.: Optoelectronic Integrated Circuits, In: *Proceedings of the IEEE*, vol. 75, No. 11, Nov. 1987, pp. 1488–1496.

Thomas, S. L.; Seller, P.:"A Silicon Pixel Detector with Routing for External VLSI Readout". In: *Nuclear Instruments and Methods in Physics Research*, A 275, 1989 pp. 564–573.

Aubert, Ph.; et al.: "Monolithic Optical Position Encoder with On–Chip Photodiodes". In: *IEEE Journal of Solid–State Circuits*, vol. 23, No. 2, Apr. 1988, pp. 465–473.

*Primary Examiner*—J. Carroll
*Attorney, Agent, or Firm*—Spencer & Frank

[57] ABSTRACT

The invention relates to a combination of monolithically integrated semiconductor arrays each having a number of prefabricated standard elements that can be connected together using one or more metalization layers to form different signal processing units. The standard elements prefabricated on the semiconductor array comprise a number of base cells, a number of capacitors, a number of output transistors and a number of photodiodes arranged in rows and columns. The base cells each contain a number of npn and pnp transistors and a number of resistors. The common arrangement of base cells for signal processing and a photodiode array arranged in rows and columns in addition to the capacitors and output transistors permit low cost manufacture at short notice and in small production quantities of a wide variety of different photodetectors with integrated electronic circuits.

7 Claims, 2 Drawing Sheets

INTEGRATED SEMICONDUCTOR ARRAY COMBINATION WITH STANDARD ELEMENTS

This application is a continuation of application Ser. No. 08/136,822, filed Oct. 18, 1993, abandoned.

BACKGROUND OF THE INVENTION

The invention relates to monolithically integrated semiconductor array having a number of standard elements that can be connected together using one or more metalization layers to form different signal processing units.

Such arrays are used in particular in the field of customized integrated circuits and are known from—for example—EP-PS 20 116, which describes an array having a plurality of prefabricated base cells on a semiconductor chip. The base cells each contain transistors, diodes, resistors and other components. The arrays with prefabricated base cells are manufactured in large numbers without signal processing circuits being already realized on the semiconductor chip. The circuit arrays are then produced by the individual design of the metalization layers. Since only a few masks are necessary for this process step, depending on the complexity of the circuit array, production of small quantities in line with customer requirements is possible. As a result, small production quantities of customized circuits can be manufactured at acceptable costs.

A monolithic circuit array for detection of light signals, and further signal amplification and processing is known from DE-PS 40 06 504. A drawback of this known monolithic circuit array is however that it is not suitable for inexpensive production in small quantities.

SUMMARY OF THE INVENTION

The object underlying the invention is therefore to provide a combination of semiconductor array permitting low cost development and production of circuit arrays with integrated light receivers in small production quantities. This object is attained by a combination of integrated semiconductor arrays having a number of standard elements that can be connected together using one or more metalization layers to form different circuit arrays. The semiconductor arrays each comprise a number of base cells having npn and pnp transistors and resistors, a number of large-area capacitors, a number of output transistors, and a number of photodiodes arranged in rows and columns. The further embodiment of the invention is the subject of the features in the dependent claims.

DETAILED DESCRIPTION OF THE PREFERRED EMBODIMENTS

Figure 1:
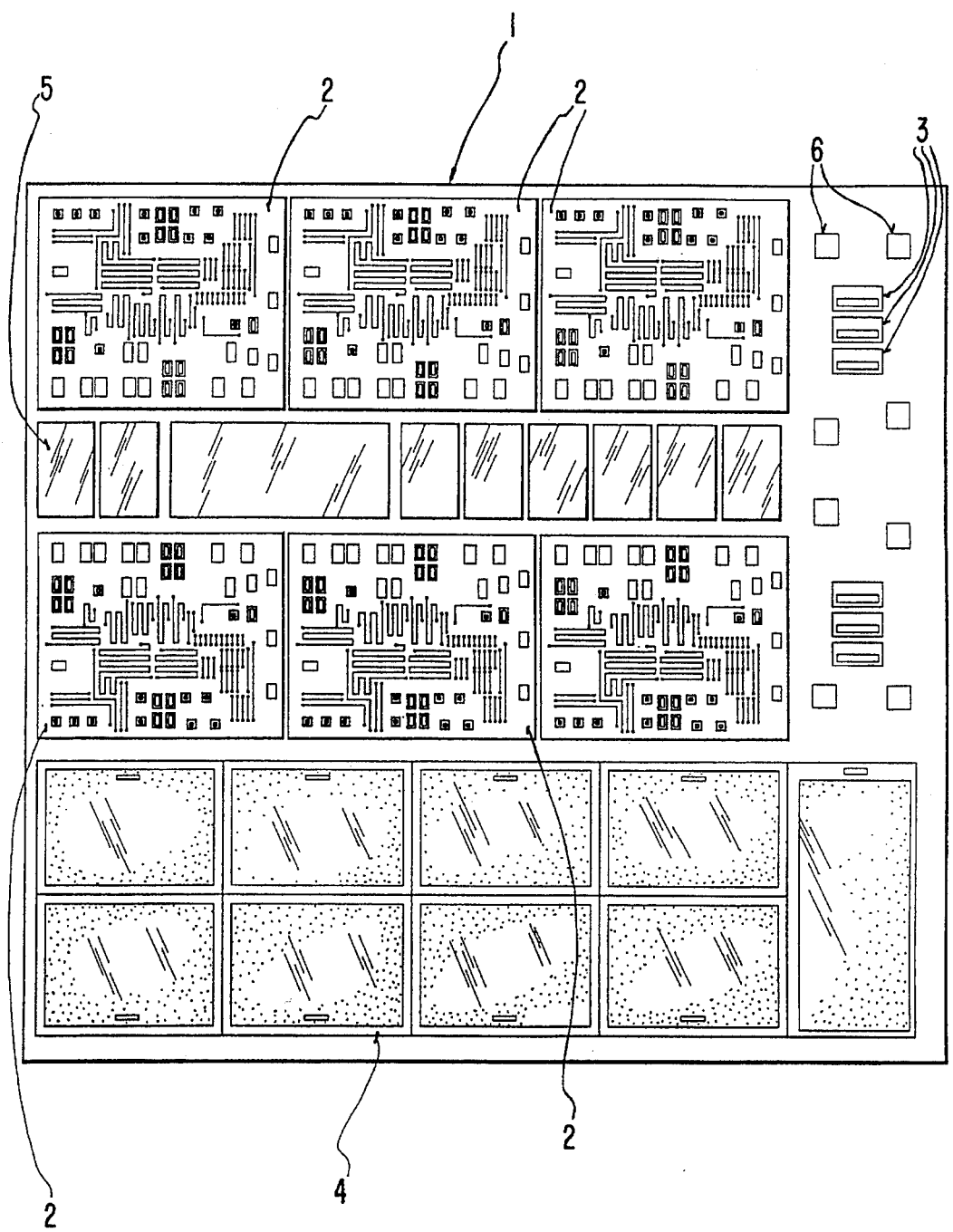
FIG. 1 is a plan view of an embodiment of a monolithically integrated semiconductor array in accordance with the invention.

The following describes an embodiment of the invention on the basis of the drawing figures.

FIG. 1 shows an embodiment of the semiconductor array in accordance with the invention. A number of base cells 2, a number of output transistors 3 and a number of capacitors 5 are arranged on the semiconductor chip 1. All base cells are of identical design, and each contains the same number of components, npn and pnp transistors and resistors. The quantity, selection and arrangement of the components is chosen such that a complete functional block of the circuit array can be provided with one base cell 2. This is achieved, if necessary, by incorporation of the output transistors 3 and/or the capacitors 5. The functional blocks realized within one base cell 2 include an operational amplifier with frequency response compensation, various other amplifiers, an integrator, a comparator and a Schmitt trigger. Additional functional units can of course be designed as well, according to the demands of the user and possibly including several base cells 2. The output transistors 3 are intended preferably for driving loads at the output of the circuit. In accordance with the invention, a number of photodiodes 4 are also integrated in the semiconductor array 1. It is of advantage not to provide one large photodiode, but a number of smaller photodiodes 4 arranged in rows and columns. The photodiodes 4 can be connected both to each other and to the remaining standard elements—like the base cells 2 and the remaining standard elements—in order to suit customer requirements. This arrangement of the photodiodes 4 in rows and columns allows various detector sizes and configurations, which are obtained by different metalization layers. For example, all the photodiodes can be connected together to form one large light-sensitive detector. Parallel connection of photodiode cells and signal processing circuits permits, for example, simple manufacture of multi-channel detectors. In another example the connection of four adjacent photodiodes is provided to form a quadrant detector. It is furthermore possible to cover one or several photodiodes partially or completely with a metalization layer.

In the embodiment according to the FIG. 1, a row of capacitors 5 is arranged between two rows of base cells 2 in order to enable optimum access. It is advantageous for the base cells 2 of the second row to be mirror images of the base cells 2 of the first row, such that the same areas of the respective base cells 2 face the capacitors 5 in each case.

In the area intended for the output transistors 3, a number of output pads 6 are provided, through which the external connection of the circuit array still to be provided can be made.

The circuit is now manufactured exclusively using the metalization layers on the prefabricated wafers. For the design various functional blocks are available as library elements and can be called up by the circuit designer. These measures permit a considerable reduction in time needed for the design of optical sensors.

Customized circuits with integrated photodiodes can be manufactured at low cost and at short notice even in small production quantities thanks to this concept.

Figure 2:
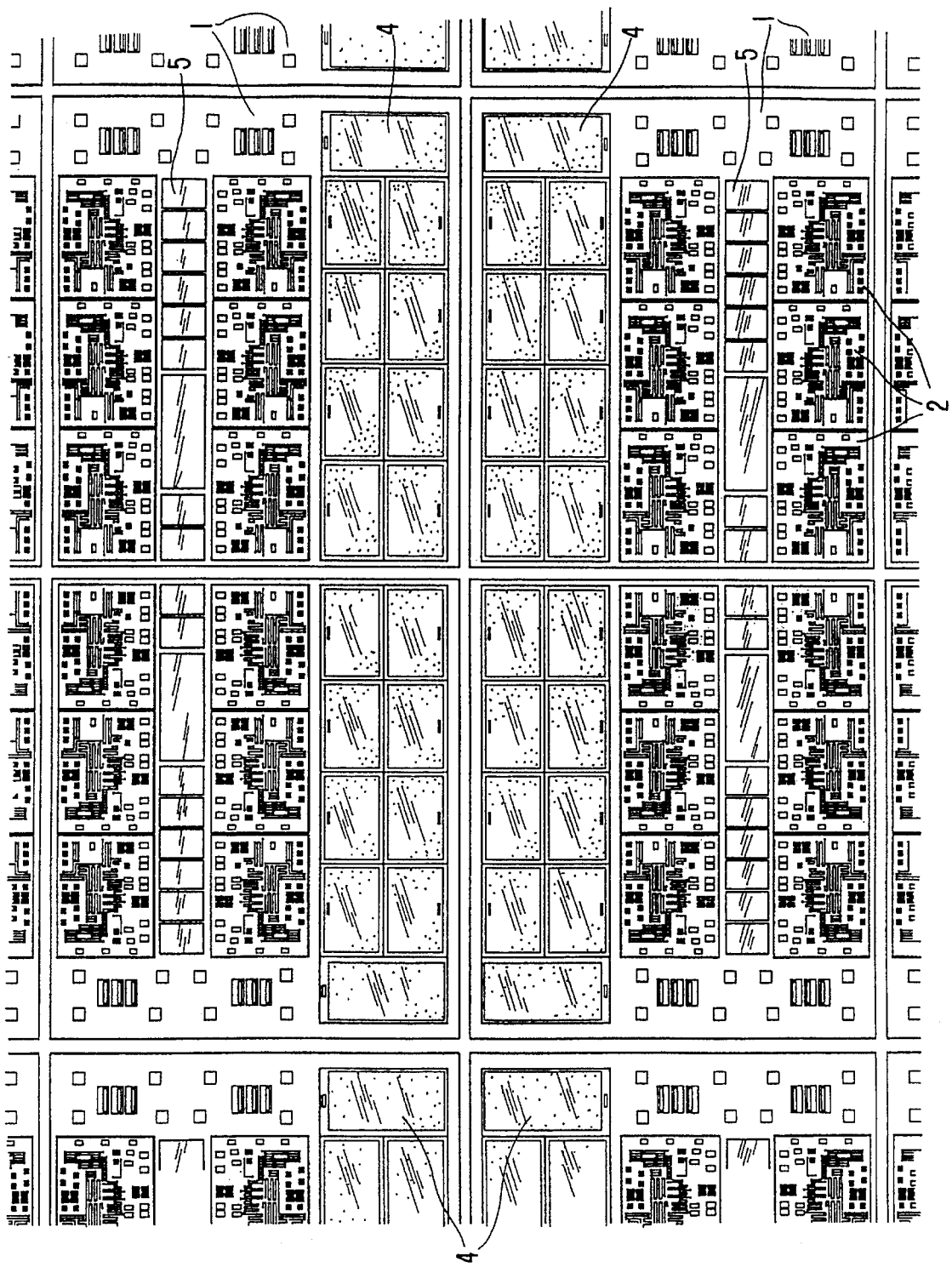
FIG. 2 is a view of an embodiment of a combination array of a plurality of monolithically integrated semiconductor arrays of the type shown in FIG. 1 in accordance with the invention.

A further advantageous embodiment of the invention shown in FIG. 2 provides for placing the semiconductor arrays on a semiconductor wafer, such that each four semiconductor arrays are combined into a block. The number of photodiode rows and photodiode columns is doubled in each case. The photodiodes should always be adjacent to one another in the four-array block by mirror-imaging of the semiconductor array. Furthermore, it is advantageous for the output transistors to be near the edges of the four-array block as shown. Adjacent arrays are connected on the wafer by metalization layers to form a single circuit- or detector array.

If, for example, two arrays are connected, a larger-area array with double the number of standard elements 2 to 6 is obtained. Applications requiring a larger number of standard elements or a different spatial arrangement of the photodiode cells can now be achieved by combining several semiconductor arrays on the wafer, without changing the structure of the prefabricated wafer. This makes the concept of customized circuits with integrated photodiodes extremely flexible.

What is claimed is:

1. A combination array of monolithically integrated semiconductor arrays disposed on a surface of a semiconductor wafer, each of said semiconductor arrays having a number of standard elements that can be connected together using one or more metalization layers to form different circuit arrays, with each of said semiconductor arrays comprising:

a number of base cells having npn and pnp transistors and resistors;

a number of large area capacitors;

a number of output transistors; and a number of photodiodes arranged in rows and columns; and wherein a plurality of said semiconductor arrays adjacent on said surface of said semiconductor wafer are connected together through said metalization layers such that a single semiconductor combination array is obtained with increased area and a multiplied number of standard elements, said semiconductor arrays being repeated on said wafer in four-array blocks, each of said four-array blocks having edges, the photodiodes being arranged in rows and columns on the individual semiconductor arrays and being adjacent to one another on each of said four-array blocks by mirror imaging of the semiconductor arrays, and the output transistors of said individual semiconductor arrays being near the respective edges of each of said four array blocks.

2. A combination array according to claim 1, wherein said cells surround said number of large-area capacitors.

3. A combination array according to claim 1, wherein said base cells are mainly used for signal processing.

4. A combination array according to claim 1, wherein a functional block of each of the different circuit arrays is realized within a base cell using one or more metalization layers.

5. A combination array according to claim 1, wherein a functional block of each of the different circuit arrays to be realized is formed by including several base cells and further standard elements.

6. A combination array according to claim 4 wherein said functional block is one of an amplifier, an integrator, a comparator, and a Schmitt trigger.

7. A monolithically integrated semiconductor array according to claim 5, wherein said functional block is one of an amplifier, an integrator, a comparator and a Schmitt trigger.

* * * * *